United States Patent
Matsumoto

(10) Patent No.: US 8,108,162 B2
(45) Date of Patent: Jan. 31, 2012

(54) LOAD CALCULATION CONTROL METHOD AND APPARATUS

(75) Inventor: Kesafumi Matsumoto, Atsugi (JP)

(73) Assignee: Koken Company, Limited, Kanagawa (JP)

( * ) Notice: Subject to any disclaimer, the term of this patent is extended or adjusted under 35 U.S.C. 154(b) by 517 days.

(21) Appl. No.: 11/921,258

(22) PCT Filed: May 30, 2006

(86) PCT No.: PCT/JP2006/310794
§ 371 (c)(1),
(2), (4) Date: Nov. 29, 2007

(87) PCT Pub. No.: WO2006/132113
PCT Pub. Date: Dec. 14, 2006

(65) Prior Publication Data
US 2009/0234600 A1    Sep. 17, 2009

(30) Foreign Application Priority Data

Jun. 8, 2005   (JP) ................................. 2005-167774

(51) Int. Cl.
G01R 19/165    (2006.01)
G01R 19/08     (2006.01)
G01R 19/12     (2006.01)
G01R 19/17     (2006.01)

(52) U.S. Cl. ................. 702/64; 702/57; 702/60; 702/65
(58) Field of Classification Search .................. 702/57, 702/60, 62, 64, 65, 78, 117, 142, 178, 183, 702/185; 257/575; 307/112; 323/223, 258; 323/263; 338/319; 361/62; 363/86
See application file for complete search history.

(56) References Cited

U.S. PATENT DOCUMENTS

| | | | | |
|---|---|---|---|---|
| 4,692,686 A | * | 9/1987 | Thomas | 323/263 |
| 6,229,288 B1 | * | 5/2001 | Baretich et al. | 323/223 |
| 6,570,240 B1 | * | 5/2003 | Ohyanagi et al. | 257/575 |
| 6,653,928 B1 | * | 11/2003 | Kondo | 338/319 |
| 6,987,678 B2 | * | 1/2006 | Giandalia et al. | 363/86 |
| 7,049,795 B2 | * | 5/2006 | Beckwith | 323/258 |
| 7,535,126 B2 | * | 5/2009 | Matsumoto | 307/112 |
| 2005/0231868 A1 | * | 10/2005 | Matsumoto | 361/62 |

FOREIGN PATENT DOCUMENTS

JP    63-10562    3/1988
(Continued)

*Primary Examiner* — Michael Nghiem
*Assistant Examiner* — Felix Suarez
(74) *Attorney, Agent, or Firm* — Jordan and Hamburg LLP

(57) ABSTRACT

A load calculation control method and apparatus for load characteristic tests of electric generator is provided, which enables continuous and precise following of a load control value. In this apparatus, a resistor bank α, which is to be connected to a load apparatus provided with a power supply apparatus (G), a ground relay (GR), a voltmeter (V), an electric power meter (P), an ampere meter (A), and main circuit breakers (CB, CBH), is divided into two or more (2-N). A switch (CL/CH) and a controller (CV) are connected to each resistor bank ($\alpha 1$-$\alpha N$). and a power capacity obtained by dividing, maximum power capacity of resistor bank groups ($\alpha L$, $\alpha H$) by two through ($2^{n-1}$). The controller (CV) includes a control value storing circuit (MC) and a comparing/transmitting circuit (OC) that compares the power capacity value of the resistor banks ($\alpha 1$-$\alpha N$) with the load control value and that transmits ON/OFF signals to the switches (CL, CH) connected to the resistor banks ($\alpha 1$-$\alpha N$).

14 Claims, 9 Drawing Sheets

FOREIGN PATENT DOCUMENTS

| | | |
|---|---|---|
| JP | 4-218902 | 8/1992 |
| JP | 6-034725 | 2/1994 |
| JP | 7-050204 | 2/1995 |
| JP | 2000-162291 | 6/2000 |
| JP | 2003-033479 | 2/2003 |
| JP | 2003-193358 | 7/2003 |
| JP | 2005-033863 | 2/2005 |

* cited by examiner

PRIOR ART

LOAD CALCULATION CONTROL METHOD AND APPARATUS

TECHNICAL FIELD

The present invention relates to a load calculation control method, which is used for load characteristic tests of high-voltage power generators, using a dry-type metal resistor, and to an apparatus used directly for carrying out the method.

BACKGROUND ART

Conventionally, a water tank system and a dry-type load system using a metal resistor have been used for carrying out load characteristic tests of a power generator.

For load characteristic tests about 20 years ago, a water tank system has been mainly used wherein three electrodes are suspended from above such that a potion of the electrode is submerged in an electrode-water-filled tank having a vertical length of 2 m, a horizontal length of 2 m, and a height of 1.5 m and wherein a continuous power conditioning is performed while adjusting the submerged length of the portion.

In such a water tank system, however, increase of power consumption causes a temperature rise of the electrode water. When the temperature of the electrode water reaches about 75° C. under a high voltage condition, arc discharge starts to take place. Thus, in order to suppress such arc discharge, there have been attempts to decrease the temperature of the electrode water by frequent supply of cool water. With this, however, as cool water is supplied, a large amount of water which has been increased in temperature up to about 75° C. must be drained accordingly. The volume thereof reaches as much as 16 m³ per hour.

In order to solve the problem with the drainage of hot water caused by the aforementioned water tank system, the present inventor used, as a load characteristic test method not using electrode water, a load characteristic test method disclosed in commonly-owned Japan Patent No. 1462423 wherein a pure-water resistor that is a load device system is used. The pure-water resistor comprises a cylindrical base electrode, a main electrode passing through the bottom of the base electrode, and an insulating cylindrical sheath disposed between these electrodes, wherein electrode water between these electrodes is used as a resistance for consuming electric power and therefore continuous load adjustment is ensured.

According to this method, the electrode water heated to a high temperature is cooled by a blower and water spray and then recycled. As a result, the amount of water consumption can be reduced to as small as one-tenth of the water consumption amount required for the aforementioned water tank system, and a beneficial effect that the drainage of industrial water is made unnecessary is achieved.

Such a load device system using a pure-water resistor has an advantage that a continuous load adjustment is provided without draining hot electrode water. However, similarly to the water tank system, the use of such a system requires a large amount of electrode water for operating the system. Further, when the system operating environment is, for example, a norther province environment or the like, there is a risk that the electrode water is frozen under a below-zero environment during wintertime. Thus, the maintenance thereof would take more time and effort.

As described above, in a facility where a hot water cannot be processed or where water supply is difficult to be secured, a load device using a dry-type metal resistor can alternatively be used as a device for load adjustment without using electrode water. However, this is not a complete solution because a metal resistor is poor in insulation performance, and therefore it often includes such a risk factor that the metal resistor itself burns.

In order to solve the aforementioned problem, the present inventor developed, as disclosed in Japanese Patent Application No. 2003-193358, a dry-type high-voltage load system wherein a resistor element is supported by an insulating sheath suitable for an operating voltage, as a result of which unexpected arc discharges and chain breaking between resistor elements are suppressed and firing of a metal resistor is prevented.

DISCLOSURE OF THE INVENTION

Problem to be Solved by the Invention

In the case of performing fine regulation of high voltage by the use of a load device comprising a resistor element disclosed in Japanese Patent Application No. 2003-193358, if, for example, a load device having a capacity of 2000 kW is used, a high-voltage bank composed of three banks of 500 kW and one bank of 250 kW and a low-voltage bank composed of one bank of 125 kW and two banks of 62.5 kWs may be provided and connected to each other through a transformer. The banks of the high-voltage bank allow for rough regulation, and various combinations of the banks of the low voltage banks allow for fine regulation.

Specifically, when the aforementioned low-voltage bank is used, the minimum selectable increment for adjusting to obtain a target load adjustment value is 62.5 kW. The resolution, which shows the accuracy of the load control value with respect to the target value, is determined as 3.125% by Formula 1 as follows:

[Formula 1]

$$62.5/2000 = 3.125\% \qquad (1)$$

At this time, the least common multiple of the target value is 62.5 kW. Thus, when a value other than multiples of 62.5 kW is selected as a target value, it is common that a sliding transformer is used for the bank having the minimum capacity.

However, in order to perform smooth adjustment of a load control value using a sliding transformer, a two-step process by setting a ON/OFF state of the bank having the minimum capacity and then performing adequate slide-adjustment is necessary, which causes the disadvantage that smooth adjustment of a load control value is difficult.

Further, when the bank of 500 kW is turned on at room temperature, there is the nature that the value converges depending on the temperature coefficient of the metal resistor over a time. When the temperature coefficient is 5%, even if the value at power-up is initially 525 kW, it converges to 500 kW over time. Thus, even if a bank combination corresponding to a target value is mathematically determined and used, the value thereof changes after a few minutes. For this reason, it becomes substantially impossible to keep a target value even if subsequent following adjustments are repeatedly performed.

In addition, in order to perform such adjustment for a try-out operation in a site environment, an operator who performs adjustments near the sliding transformer and another operator who operates the load device are required. Since the noise produced during operation of a diesel engine is as great as 120 dB, communication of information regarding a target value between the operators by hearing become very difficult, which may result in erroneous operation.

As a solution to the aforementioned problems, Japanese Patent Application No. 2003-193358 proposes a method of approaching a load control value to an optional value using a switch adapted for a three-phase resistor circuit so that switching between a shared-use mode for the high and low voltage banks and a high-voltage mode dedicated for the high voltage bank is possible. Although this solution provides a speedup of the load adjustment process, the required number of the switches becomes nearly three times as many as required hitherto, which increase the structural complexity, size and cost of the device. Further, the accuracy obtained by the method is as much as 4.5% which is nearly the same as that obtained hitherto.

Further, using a large number of switches may result in increase of failure frequency and increase in complexity of maintenance, adjustment and repair of the system. Thus, even though the invention of Japanese Patent Application No. 2003-193358 is practiced, the aforementioned problems are still difficult to be solved.

In view of the foregoing, objects of the invention to be achieved by the present invention are as follows.

A first object of the invention is to provide a load calculation control method and apparatus which enables continuous and precise following of a load value with respect to a load control value and enables keeping of the load value without using industrial water.

A second object of the invention is to provide a load calculation control method and apparatus which enables continuous and precise load adjustment with a smaller amount of switches than hitherto, thereby decreasing production cost and improving ease of maintenance.

A third object of the invention is to provide a load calculation control method and apparatus wherein a load control value is automatically calculated, thereby saving manual bank-combination calculation.

Other objects of the invention will be readily apparent from the specification and the accompanying drawings, and especially from each of the appended claims.

Means for Solving Problems

In order to solve the aforementioned problems, an apparatus of the invention comprises load calculation control means wherein a resistor bank is connected to a load device, the load device is connected to a power supply unit by a power cable through to a load device provided with a wattmeter, a ground meter, a voltmeter, a wattmeter, an ammeter, a main break circuit, the resistor bank is divided into two or more (in the range of 2 to N), the maximum total power capacity of a resistor bank group is divided into sequentially from $\frac{1}{2}$ to $1/(2^{n-1})$ of the total capacity based on binary system, the results so obtained are allocated to the respective resistor banks, a switch and controller through which each resistor bank is connected is provided, and the control has therein a control value memory circuit for holding a load control value and a comparison and transmission circuit for comparing a power capacity value of each resistor bank with the load control value of nest higher priority which has been subjected to subtraction, and transmits an ON/OFF signal to a switch through which each resistor bank is connected.

A method of the invention provides a load calculation control method, wherein a resistor bank of a load adjustment device is divided into two or more (in the range of 2 to N), the total maximum power capacity of the resistor bank group is divided sequentially from $\frac{1}{2}$ to $1/(2^{n-1})$ of the total capacity based on binary system, the results so obtained are allocated to the respective resistor banks, a target load control value selected by a control value memory circuit is compared with the respective power capacity values allocated to the resistor banks of respective priorities and subtraction is performed for each priority by a comparison and transmission circuit, and finally a combination of ON/OFF of the respective resistor banks approximating the target value is derived.

Specifically and particularly, the problems of the invention are solved such that the foregoing objects are achieved by employing the following novel characteristic device and technique from the super-ordinate conception to the subordinate conception disclosed below in this specification.

That is, a first feature of the method of the present invention is to employ a load calculation control method used for load characteristic test of an electric generator, wherein when a resistor bank group is divided into two or more, a total power capacity of all resistors is divided and allocated to respective resistor banks which are determined one after another in a decreasing manner from a higher priority to a lower priority by comparison operation, and a combination of ON/OFF of the respective resistor banks is automatically controlled in sequence from the higher priority to the lower priority and calculated in order to approximate a target value, the method comprising the steps of: after dividing the resistor bank group connected to the electric generator via the power cable into two or more (in a range of 2 to N, where N is a natural number), allocating to a first to N-th divided resistor banks the results which is determined by dividing a total maximum power capacity of the resistor bank group sequentially based on binary system and arranging the results in a order from a higher priority to a lower priority of the power capacity corresponding to $\frac{1}{2}$ to $1/(2^{n-1})$; after a target value of the load control value is selected by the use of control means connected to each of the resistor banks, by first calculation means within a comparison and transmission circuit within the control means, comparing a power capacity to be held by a corresponding first resistor bank with the load control value, and if the load control value is not less than the power capacity, subtracting the power capacity from the load control value, storing the result as a remainder value, transmitting the remainder value to second calculation means in an analog manner, and transmitting in analog manner a digital signal representing ON-state to the first resistor bank, while when the load control value is less than the power capacity, the load control value is transmitted to the second calculation means in an analog manner; in the second to N-th calculations, sequentially comparing the remainder value received from the calculation means of next higher priority with the power capacity of the resistor bank of next lower priority, wherein in each calculation, if the received remainder value is not less than the power capacity of the resistor bank, the power capacity is subtracted from the remainder value, the result is stored as a remainder value of next lower priority and transmitted to calculation means of next lower priority in an analog manner, and a digital signal representing ON-state is transmitted to the resistor bank corresponding to the current calculation means, while when the remainder value of next higher priority is less than the power capacity, the remainder value of nest higher priority is transmitted as a remainder value of next lower priority to the calculation means of next lower priority in an analog manner.

A second feature of the method of the present invention is to employ the load calculation control method, wherein said load control value according to a first feature of the present method is increased by pushing an UP button of a push button switch connected to the control means, the result value is transmitted to a control value memory circuit of the control means, and a value stored in the control value memory circuit is updated to be increased; wherein the load control value is decreased by pushing an DOWN button of a push button switch, the result value is transmitted to the control value memory circuit, and a value stored in the control value memory circuit is updated to be decreased.

A third feature of the method of the present invention is to employ the load calculation control method, wherein said load calculation control method according to a first or second feature of the present method, wherein under a high-voltage load condition, with respect to a small-capacity resistor bank of high switching frequency, transforming means is used to convert to a low pressure such that a high-voltage resistor bank group and a low-voltage resistor bank group can be commonly used.

A forth feature of the method of the present invention is to employ the load calculation control method, wherein said load calculation control method according to a first or second feature of the present method, wherein under a low-voltage load condition, load of a small capacity resistor bank of high switching frequency is reduced by providing semiconductor switching means via which the resistor bank is connected, under a high-voltage load condition, with respect to a resistor bank of high switching frequency, a voltage is converted to be lowered by transforming means and load of especially a small-capacity resistor bank of high switching frequency is decreased by providing semiconductor switching means via which the small-capacity resistor bank is connected.

A fifth feature of the method of the present invention is to employ the load calculation control method, wherein said number N of priorities resulting from the division according to a first, second, third or forth feature of the present method is seven, and a total maximum power capacity among the resistor bank group is divided into seven priorities from $1/2$ to $1/128$ of the total capacity based on binary system.

A sixth feature of the method of the present invention is to employ the load calculation control method, wherein said total maximum power capacity among the resistor bank group according to a first, second, third, forth or fifth feature of the present method is increased by arranging in parallel a plurality of resistor banks of a required priority among N priorities obtained by division.

A first feature of the apparatus of the present invention is to employ a load calculation control apparatus, comprising: a load calculation control apparatus used for load characteristic test of an electric generator, wherein when a resistor bank group is divided into two or more, a total power capacity of all resistors is divided and allocated to respective resistor banks which are determined one after another in a decreasing manner from a higher priority to a lower priority by comparison operation, and a combination of ON/OFF of the respective resistor banks is automatically controlled in sequence from the higher priority to the lower priority and calculated in order to approximate a target value, the apparatus comprising: a plurality of resistor banks to which total power capacity among the resistor bank group is allocated sequentially from a higher priority to a lower priority in a decreasing manner based on calculation in order to divide the resistor bank into two or more (in a range of 2 to N, where N is a natural number) by branch-connecting the resistor bank to an end of a power cable connected to the power supply unit; a switch for turning ON/OFF each bank, through which each resistor bank of the resistor bank group is connected; a control value memory circuit for storing the selected load control value; a control unit having a comparison and transmission circuit, wherein the comparison and transmission circuit sequentially performs first to N-th calculations comparing the load control value transmitted from the control value memory circuit with the power capacities of the respective resistor banks corresponding to first and N-th resistor banks and making subtraction as required, and transmits a resultant digital signal calculated by the calculation to each corresponding switch to cause the switch to open or close; and a pushbutton switch having an UP button for supplying an analog value for causing a load control value selected and stored in the control value memory circuit to increase, and a DOWN button for supplying an analog value for causing the load control value to decrease.

A second feature of the apparatus of the present invention is to employ the load calculation control apparatus, wherein said first to N-th resistor banks of the resistor bank group respectively according to a first feature of the present apparatus hold the power capacity corresponding to $1/2$ to $1/(2^{n-1})$ (where N is a natural number) of the total maximum power capacity based on binary system.

A third feature of the apparatus of the present invention is to employ the load calculation control apparatus, wherein said control unit according to a first feature of the present apparatus has a control value measurement device which digitally indicates in a detectable manner the value of the load control value subjected to an updatable adjustment by means of the push button switch.

A forth feature of the apparatus of the present invention is to employ the load calculation control apparatus, wherein said load calculation control apparatus according to a first feature of the present apparatus, wherein under a high-voltage load environment, a transformer via each of the plurality of resistor banks of a lower power capacity among the resistor bank group is provided such that the each resistor bank to which the transformer is connected can be used as a low-voltage resistor bank group, wherein a high-voltage resistor bank group without the transformer and the low-voltage resistor bank group with the transformer can be used in parallel.

A fifth feature of the apparatus of the present invention is to employ the load calculation control apparatus, wherein said load calculation control apparatus according to a first feature of the present apparatus, wherein under a low-voltage load environment, a semiconductor switch through which each of the plurality of resistor banks of lower power capacity within the resistor bank group can be provided; and wherein under a high-voltage load environment, the transformer via each of the plurality of resistor banks of a lower power capacity among the resistor bank group is provided such that the each resistor bank to which the transformer is connected can be used as a low-voltage resistor bank group, and a semiconductor switch through which each resistor bank of the low-voltage resistor bank group is connected is provided.

A sixth feature of the apparatus of the present invention is to employ the load calculation control apparatus, wherein said number N of priorities obtained by division according to a second, third, forth or fifth of the present apparatus is seven, and the priorities are respectively associated with power capacities of $1/2$, $1/4$, $1/8$, $1/16$, $1/32$, $1/64$ and $1/128$ of the total maximum power capacity.

A seventh feature of the apparatus of the present invention is to employ the load calculation control apparatus, wherein said the resistor bank group according to a first, second, third, forth or fifth of the present apparatus has a plurality of resistor banks of the same required priority from the N priorities which are arranged in parallel.

A eighth feature of the apparatus of the present invention is to employ the load calculation control apparatus, wherein said power cable according to a first, second, third, forth, fifth, sixth or seventh of the present apparatus is connected to an overcurrent relay and a current meter on a load side opposite a main breaking circuit, and connected to a ground relay and a voltmeter on a power supply side and further connected to a wattmeter opposite the ammeter and the voltmeter.

Advantageous Effect of Invention

The combination of a resistor bank and a controller with a comparison and transmission circuit according to the present invention enables continuous and very accurate load adjustment with a small number of switches.

Further, automated selection of bank combination according to the present invention enables more accurate load control value setting in a shorter time, as a result of which operation time can be reduced.

Furthermore, the aforementioned automation avoids the need of selective combination operations other than pushbutton switching while watching a digital wattmeter by an operator, which provides a beneficial effect of preventing erroneous operations caused by human error and the like.

Figure 1:
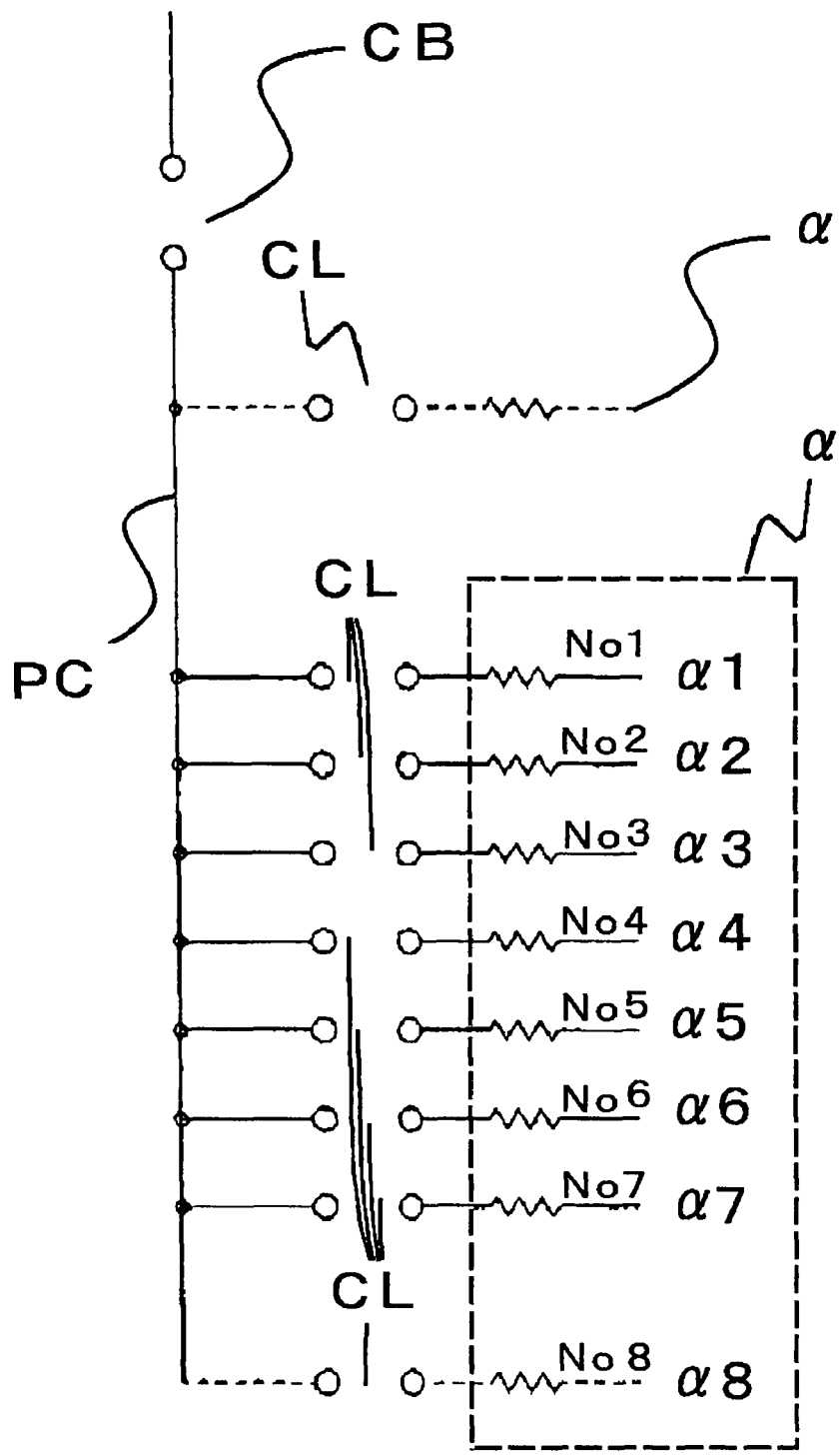
FIG. 1 is a layout block diagram of resistor banks of a load calculation control apparatus example of the invention.

| Reference Numerals | |
|---|---|
| α, α1, α2, α3, α4, α5, α6, α7, α8 | resistor bank |
| αL | low-voltage bank group |
| αH | high-voltage bank group |
| β1, β2, β3 | low-voltage load device |
| γ1, γ2, γ3, γ' | high-voltage load device |
| G | power-supply unit |
| V | voltmeter |
| A | ammeter |
| P | wattmeter |

| Reference Numerals (continued) | |
|---|---|
| PC | power cable |
| GR | ground relay |
| OCR | overcurrent relay |
| CB | main circuit breaker |
| CBH | main high-voltage circuit breaker |
| CL | low-voltage switch |
| CH | high-voltage switch |
| CV | controller |
| OC | comparison and transmission circuit |
| MC | control-value memory circuit |
| MV | control value measurement device |
| SW | push-button switch |
| SE | semiconductor switch |

BEST MODE FOR CARRYING OUT THE INVENTION

Descriptions will be given below upon an embodiment of a load calculation control apparatus which is a best mode for carrying out the present invention, and a load calculation control method corresponding thereto in this order.

(Example of Apparatus)

The principle of a load calculation control apparatus of the invention will be described first with reference to FIG. 1.

FIG. 1 is a principle diagram illustrating in terms of capacity the constitution of a resistor bank α connected to a power supply unit G. FIG. 1 illustrates a state that a resistor bank α having a maximum capacity of 2000 kW is divided into seven, and numbers allocated from resistor bank α1 of Bank No. 1 to resistor bank α7 of Bank No. 7.

The apparatus embodiment will be described by an example of an apparatus having seven resistor banks. However, the number N of the resistor banks is not restricted to seven and may be increased or decreased depending on a situation.

As set forth below in Table 1, for each register bank α, the maximum capacity 2000 kW, for example, is divided into seven based on a geometric progression by multiplying first 2000 kW and then the previous one by the common ration 0.5 and the obtained seven results are arranged in decreasing order and respectively allocated to the resistor bank α1-α7. Specifically, 1000 kW which is half of 2000 kW is allocated to the resistor bank α1, 500 kW which is half of α1 is allocated to the resistor bank α2, and the remaining capacity is allocated to the resistor banks α3-α5 in the same manner such that the capacity allocated to the preceding resistor bank is half of the previous one, and finally, the capacity value 15.625 kW of the resistor bank α7, which is half of the capacity value of the resistor bank α6, is set as the minimum value.

Further, the fractions ½ to 1/128 ($1/(2^{n-1})$) respectively allocated to the resistor banks a1 to a7 are listed as the values of respective resistor banks when the maximum capacity 2000 kW is taken as a reference value. The listed integral values used for calculation of load control values are allocated such that a reference value 1 is allocated to the resistor bank a7 and 64 is allocated to the resistor bank a1 having the maximum bank number.

TABLE 1

| | Bank No | | | Numeric String | | | | | | | | | | |
|---|---|---|---|---|---|---|---|---|---|---|---|---|---|---|
| Number | Fractions | Integral | Capacity(kw) | 1 | 2 | 3 | 4 | 5 | 6 | ... | 124 | 125 | 126 | 127 |
| 1(α1) | ½ | 64 | 1000 | 0 | 0 | 0 | 0 | 0 | 0 | | 1 | 1 | 1 | 1 |
| 2(α2) | ¼ | 32 | 500 | 0 | 0 | 0 | 0 | 0 | 0 | | 1 | 1 | 1 | 1 |
| 3(α3) | ⅛ | 16 | 250 | 0 | 0 | 0 | 0 | 0 | 0 | | 1 | 1 | 1 | 1 |
| 4(α4) | 1/16 | 8 | 125 | 0 | 0 | 0 | 0 | 0 | 0 | | 1 | 1 | 1 | 1 |
| 5(α5) | 1/32 | 4 | 62.5 | 0 | 0 | 0 | 1 | 1 | 1 | | 1 | 1 | 1 | 1 |
| 6(α6) | 1/64 | 2 | 31.25 | 0 | 1 | 1 | 0 | 0 | 1 | | 0 | 0 | 1 | 1 |
| 7(α7) | 1/128 | 1 | 15.625 | 1 | 0 | 1 | 0 | 1 | 0 | | 0 | 1 | 0 | 1 |

In this case, ON-state is indicated by 1 and OFF-state is indicated by 0. Combinations of the seven resistor banks α1-α7 using "0" and "1" result in 128 patterns, thereby producing 128 values. Thus, adjustment of the power control values is made possible by the combination of the ON/OFF sates of the respective resistor banks.

The degree of accuracy when setting a load control value by the use of the present apparatus is calculated as a resolution value 0.8% by dividing the maximum capacity value 2000 kW by 127 as represented by Formula 2:

[Formula 2]

$$1/127 = 0.008 = 0.8\% \quad (2)$$

Further, an eighth resistor bank α8 having a resistor bank No. 8 may be added. As a result of the addition, the number of partition is increased, and thereby a fraction of 1/256, the minimum control value 7.81 kW and a resolution of 0.4% are provided, which ensures more accurate setting.

Further, there is no limitation un the capacity of the resistor bank α. Thus, for example, a plurality of substantially equivalent level resistor banks α may provided in combination as required so as to extend the maximum capacity to 4000 kW, for example, by adding a bank of 2000 kW to which fraction 1/1 is allocated.

In the following, a configuration example of a load calculation control apparatus wherein the resistor bank groups in FIG. 1 are connected to a power-supply unit and used as load devices will be described in connection with FIGS. 2 and 3.

Figure 2:
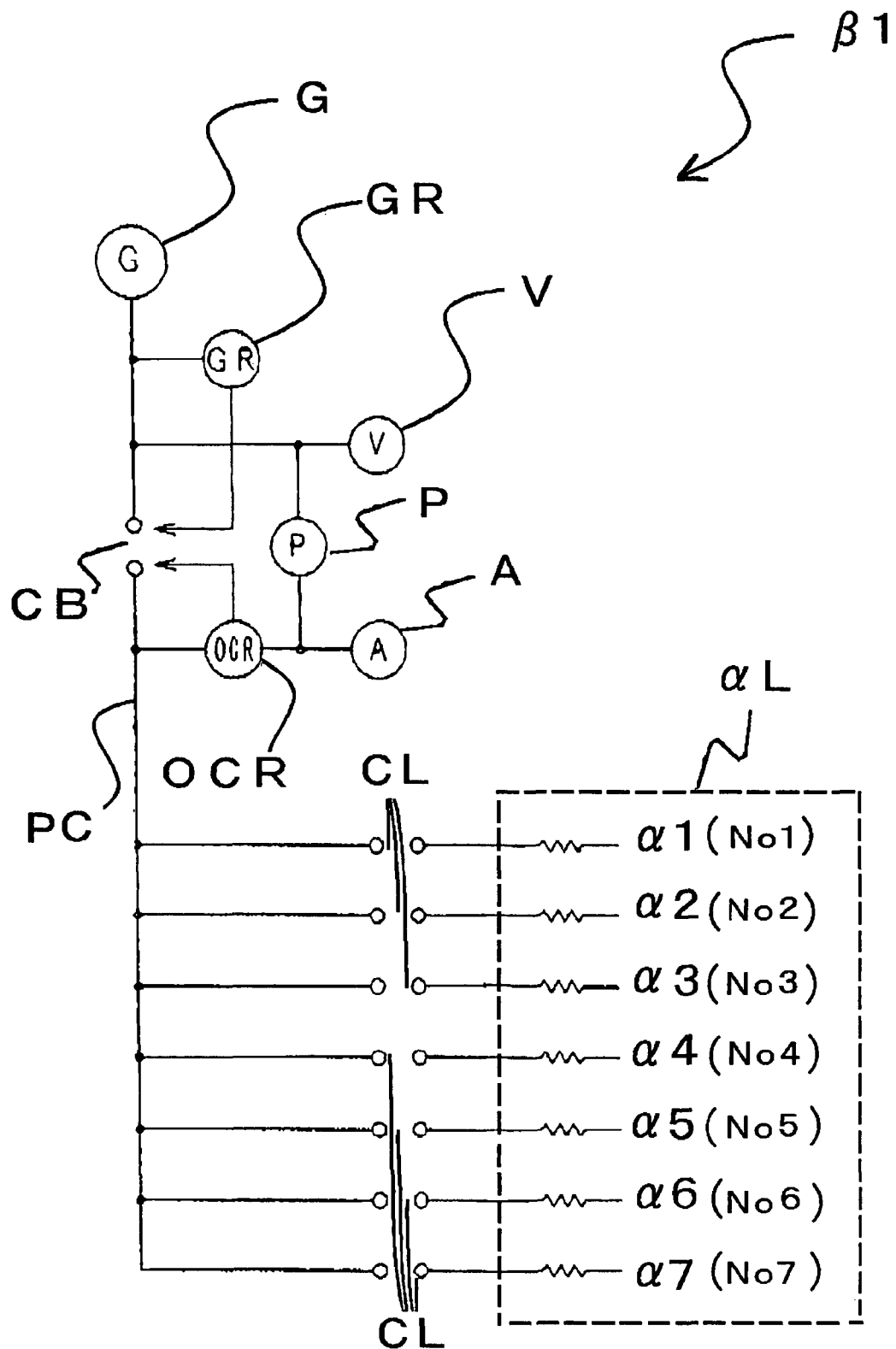
FIG. 2 is a one-line wiring diagram of resistor banks of the low-voltage load calculation control apparatus example of the invention.

FIG. 2 is a one-line wiring diagram of a low-voltage load device β1. The low-voltage device β1 serves to perform load adjustments by the use of a low-voltage bank group αL connected to a power supply unit G by a power cable PC via a voltmeter V, an ammeter A, a wattmeter P, an overcurrent relay OCR, a ground relay GP, and a main circuit breaker. The low-voltage bank group αL is arranged on a branch line at the end of the power cable PC opposite the power supply unit G.

As shown FIG. 1 and Table 2, the a low-voltage bank group αL comprises, for example, resistor banks α1 to α7 respectively indicated as No. 1 to No. 7 to which seven different values are allocated which are respectively obtained by dividing 2000 kW once to seven times into equal halves. Each of the resistor banks α1 to α7 is connected to the power supply unit G through a low-voltage switch CL by the power cable PC.

Figure 3:
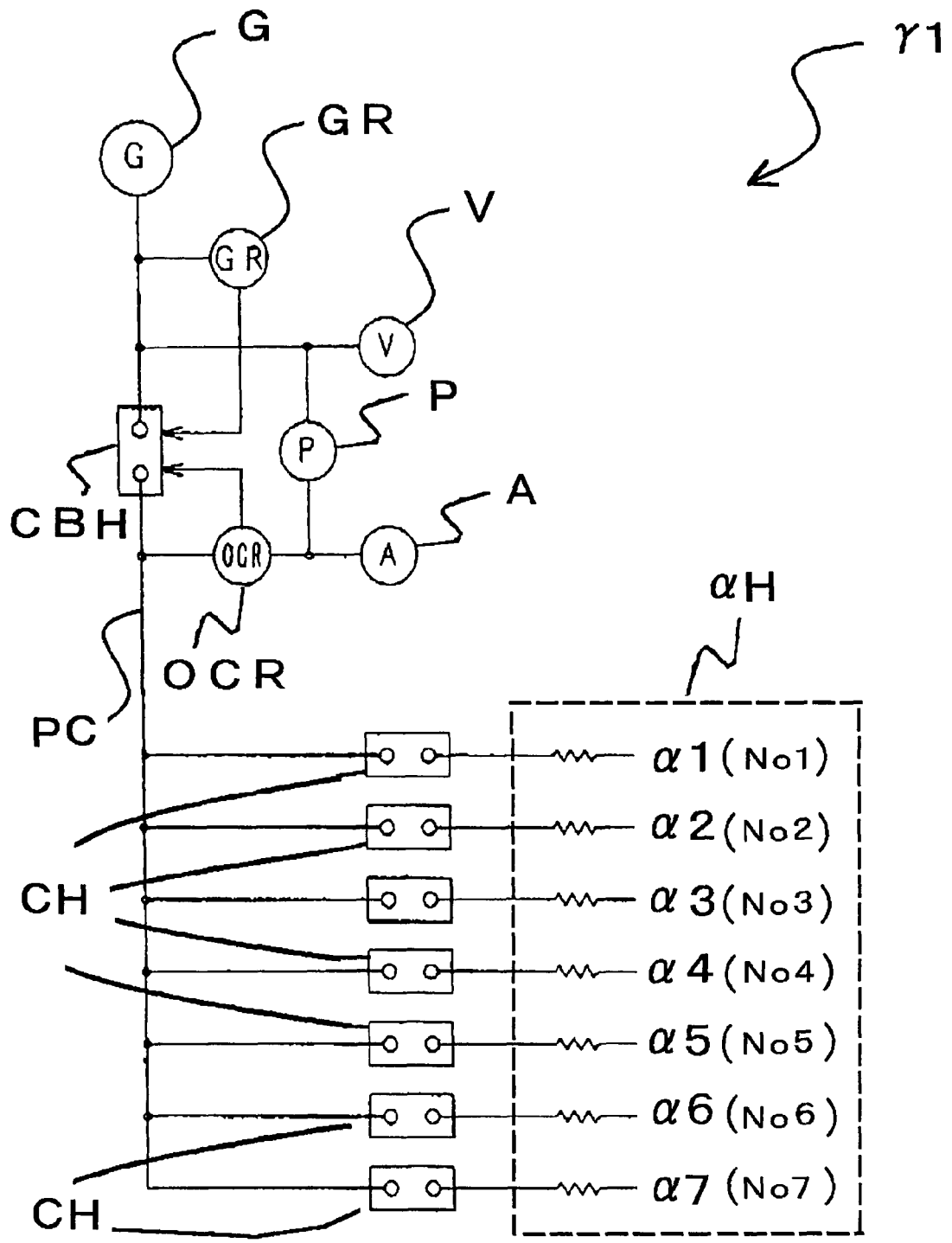
FIG. 3 is a one-line wiring diagram of resistor banks of the high-voltage load calculation control apparatus example of the invention.

FIG. 3 shows a block diagram when the high-voltage resistor bank group αH is connected to a high-voltage resistor device γ1. The layout configuration thereof is similar to that of the low-voltage load device example in FIG. 2, but the switch and the circuit breaker are replaced with a high-voltage switch CH and a high voltage breaker CBH in order to withstand high voltage.

Figure 4:
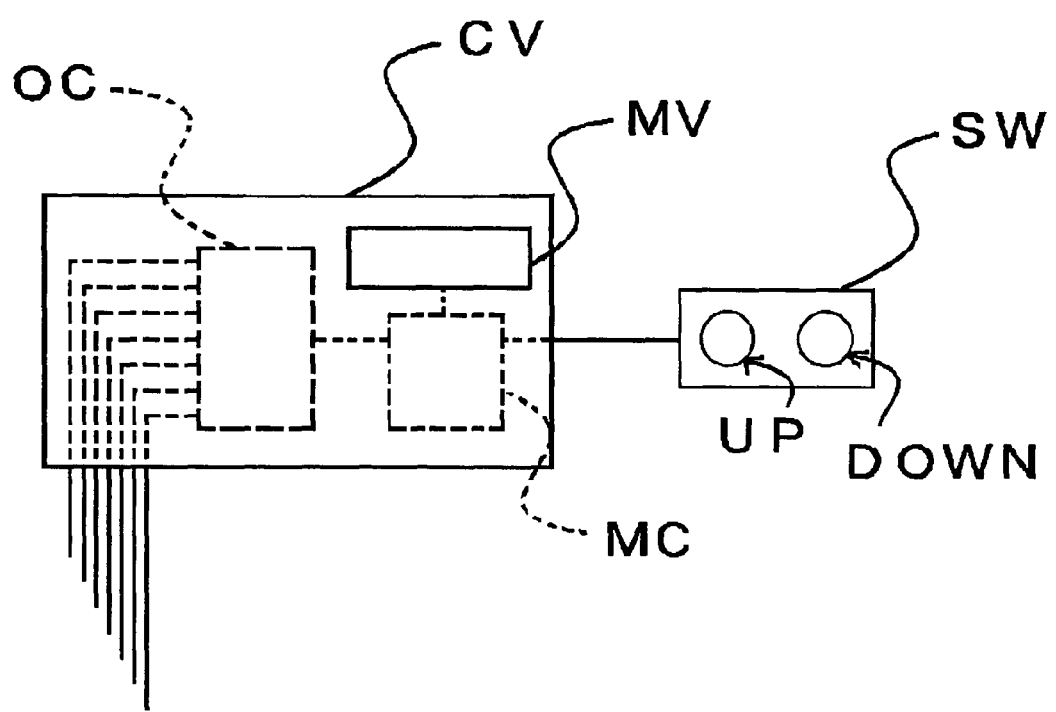
FIG. 4 is a layout block diagram of a controller and push-button switches of the load calculation control apparatus example of the invention.

Further, an example wherein a control CV is connected to the load calculation control apparatuses β1 and γ1 shown in FIGS. 2 and 3 will be described below with reference to FIG. 4 showing a block diagram of the controller CV and a push button switch SW and FIGS. 5 and 6 respectively showing one-line wiring diagrams of the structures of the load calculation control apparatuses β2 and γ2.

FIG. 4 is a block diagram showing a push button switch SW, connected to the controller CV, for setting a load control value with respect to low-voltage switches CL and high-voltage switches CH through which resistor bank α1-α7 are connected.

As shown in FIG. 4, the controller CV comprises: a control-value memory circuit MC for storing within the controller a load control value targeted for a load value; a control value measurement device for carrying out memory indication of the load control value using digital numerals which can be visually checked; and a comparison and transmission circuit OC wherein a comparison operation for comparing the load control value stored in the control value memory circuit MC with the electric capacity of each resistor bank α is automatically repeated in order to obtain a selective combination of the ON/OFF of the resistor banks α1 to α7 which produces a value closest to the load control value, and the selected combination is actually controlled to be transmitted to the resistor banks α1 to α7 as ON/OFF digital signals. Further, a button or switch (not shown) may be used as a trigger for starting the comparison operation.

Specifically, the comparison and transmission circuit OC includes first to N-th calculation circuits respectively corresponding to the times N of division for the respective graded resistor banks α, and subjects the load control value received from the control value memory circuit MC to the comparison operation and transmits the results as an ON/OFF digital signal.

The push button switch SW has an UP button and a DOWN button disposed therein. The push button switch SW outputs in an analog fashion a contact input UP for increasing a target load control value and a contact input DOWN for decreasing the target load control value to the controller CV. The controller CV holds the load control value received from the push button switch SW in the control value memory circuit.

Figure 5:
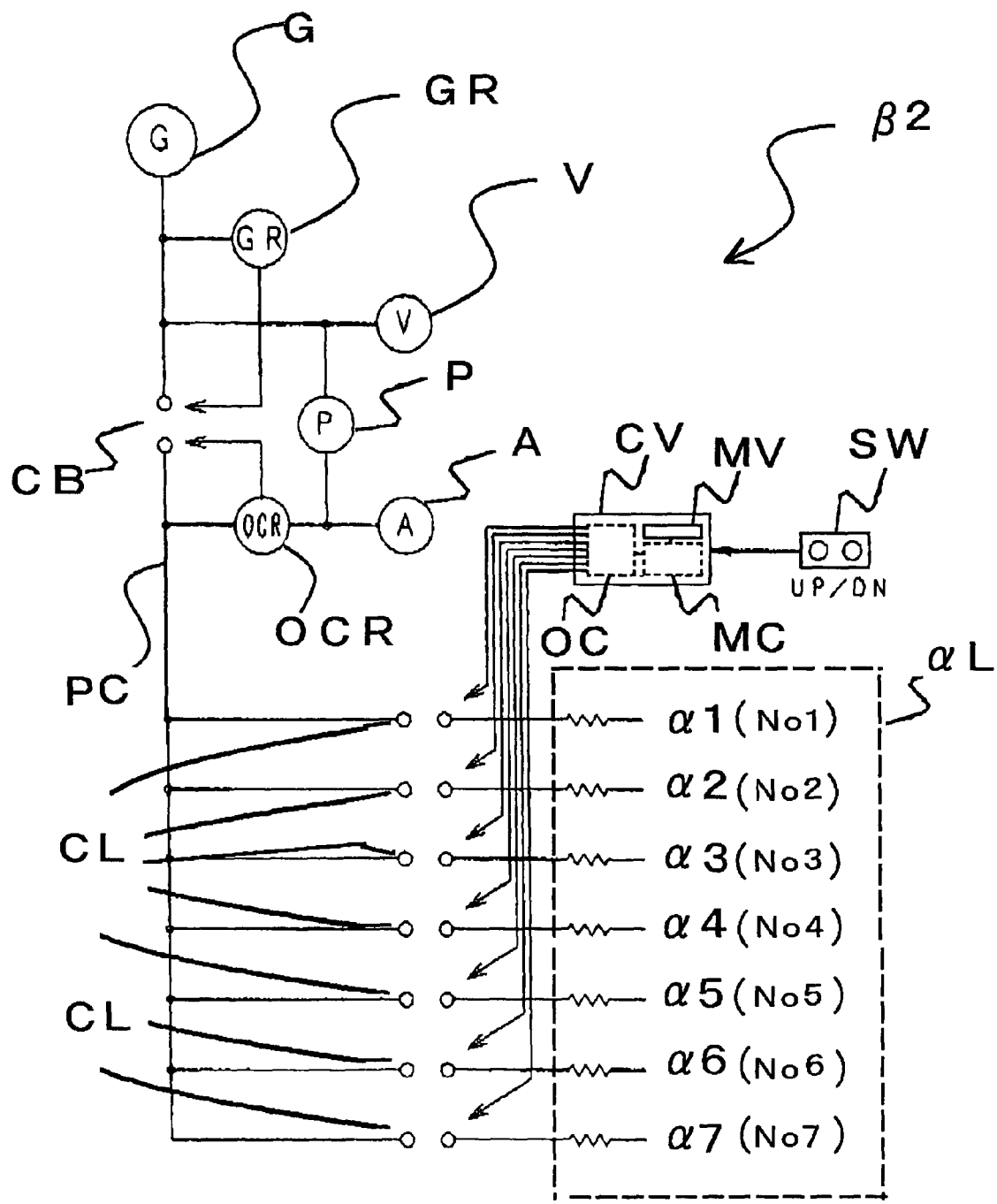
FIG. 5 is a one-line wiring diagram of a low-voltage load calculation control apparatus provided with a controller according to the load calculation control apparatus example of the invention.

FIG. 5 shows a load calculation control apparatus example β2 using a low-voltage resistor bank group αL. The load calculation control apparatus example β2 is produced by further providing the aforementioned controller CV and switch SW to the load calculation control apparatus in FIG. 2.

As shown in FIG. 5, the resistor bank having a maximum capacity of 2000 kW in total are divided into seven grades based on a geometric progression by multiplying first 2000 kW and then the previous one by the common ration 0.5. The seven results are numbered and allocated as resistor bank α1-α7. The resistor banks α1-α7 and the controller CV are connected across seven low-voltage switches are such that an ON/OFF digital signal from a comparison and transmission circuit OC within the controller CV can be transmitted to each of the seven low-voltage switches CL.

Method Example

In the following, a series of processing steps of a load calculation control method for automatically controlling ON/OFF of each resistor bank by comparing a power capacity of each resistor bank with a load control value as a target load by the use of switches connected to the resistor banks No. 1 to No. 7 described in connection with the aforementioned apparatus example and a controller.

Before carrying out a load characteristic test, a target load control value is selected by increasing or decreasing the indicated value by pushing the UP/DOWN button of the push button switch SW connected to the controller CV. At this time, whenever the UP/DOWN button of the push button switch is pushed, a value to be increased or decreased is directly analog-output to the controller CV. Whenever the controller CV receives an UP/DOWN signal, a relevant load control value is held in a control value memory circuit and digitally represents the load control value on the control value measurement device. The reason of the digital representation is that the load control value suffers less misreading. Thus, after operation, whether or not the operation is normal can be determined by visually checking the value indicated by the wattmeter P and the value indicated by the control value measurement device MV.

When execution of the comparison operation is urged by a button or switch (not shown) after setting a load control value, the control value memory circuit MC transmits in an analog fashion a selected load control value to the comparison and transmission circuit OC.

When receiving the load control value from the control value memory circuit MC, the comparison and transmission circuit starts comparison in order to transmit the value as an ON/OFF digital signal to the respective resistor banks $\alpha 1$-$\alpha 7$ provided by dividing the load control value based on a geometric progression.

Calculation steps in the comparison and transmission circuit OC of a first to 7th priority associated with the respective resistor banks $\alpha 1$-$\alpha 7$ are as shown in Table 2. A target load control value is compared with the respective resistor bank capacities one-by-one in order of magnitude. The control value is set based on repeated calculations and addition.

ON is supplied to a switch (the low-voltage switch CL in FIG. 5 and the high voltage switch in FIG. 6) of Bank No. 1, whereas the control value is less than 1000 kW, a digital signal representing OFF is supplied.

When the digital signal represents ON, a half value of the load control value is subtracted from the load control value, and the result is held as a remainder value 1. On the other hand, the digital signal represents OFF, the load control value itself is held as a remainder value 1. The remainder value 1 so obtained is forwarded in an analog manner to the calculation step of the second priority.

Calculations beginning with the calculation of second priority are performed similar to the calculation of first priority. Whether ON or OFF signal is to be output is determined respectively for Bank No. 1 to Bank No. 7 while transmitting ON or OFF digital signal as shown in Table 2.

In this case, it is required to output the ON/OFF signals substantially at the same time by completing a cycle from the calculation of the first priority to the calculation of the 7th priority within about 0.1 seconds.

Embodiments 1

In the following, embodiments 1 and 2 of the invention using the foregoing apparatus example and method example are described with reference to the one-line wiring diagrams in FIGS. 6-8.

First, the structure of a high-voltage load device $\gamma 2$ will be described in connection with FIG. 6, wherein combined application of a high-voltage bank $\alpha H$ and a low-voltage bank $\alpha L$ is enabled by connecting the high-voltage load device $\gamma 2$ to the aforementioned high-voltage load device $\gamma 1$ shown in FIG. 3 via the controller CV and the push button switch SW and to the power cable PC via the transformer TR.

For a high-voltage load device wherein a load control value is set by the use of a controller CV by dividing a resistor bank into seven based on a geometric progression by multiplying first the load control value and then the previous one by the common ration 0.5 similar to the conventional load devices, continuous load adjustments are possible. However, when a step turning the switch to ON-state is counted as one step, if load characteristic tests from 0 kW to 2000 kW are performed in sequence, the number of steps required for the resister bank $\alpha 1$ is one step whereas the number of steps required for the

TABLE 2

| | Comparison operation | Swich | Result of caluculation |
|---|---|---|---|
| First caluculation | Control value(target value) > $\frac{1}{2}$ | ON | Control value(Target value) − $\frac{1}{2}$ = Remainder value1 |
| | Control value(Target value) < $\frac{1}{2}$ | OFF | Control value(Target value) = Remainder value1 |
| Second caluculation | Remainder value1 > $\frac{1}{4}$ | ON | Remainder value1 − $\frac{1}{4}$ = Remainder value2 |
| | Ramainder value1 < $\frac{1}{4}$ | OFF | Remainder value1 = Remainder value2 |
| Third caluculation | Remainder value1 > $\frac{1}{8}$ | ON | Remainder value2 − $\frac{1}{8}$ = Remainder value3 |
| | Remainder value1 < $\frac{1}{8}$ | OFF | Remainder value2 = Remainder value3 |
| Fourth caluculation | Remainder value1 > $\frac{1}{16}$ | ON | Remainder value3 − $\frac{1}{16}$ = Remainder value4 |
| | Remainder value1 < $\frac{1}{16}$ | OFF | Remainder value3 = Remainder value4 |
| Fifth caluculation | Remainder value1 > $\frac{1}{32}$ | ON | Remainder value4 − $\frac{1}{32}$ = Remainder value4 |
| | Remainder value1 < $\frac{1}{32}$ | OFF | Remainder value4 = Remainder value5 |
| Sixth caluculation | Remainder value1 > $\frac{1}{64}$ | ON | Remainder value5 − $\frac{1}{64}$ = Remainder value6 |
| | Remainder value1 < $\frac{1}{64}$ | OFF | Remainder value5 = Remainder value6 |
| Seventh caluculation | Remainder value1 > $\frac{1}{128}$ | ON | End of caluculation |
| | Remainder value1 < $\frac{1}{128}$ | OFF | |

Specifically, the second calculation step compares a control value (load control value) with 1000 kw (i.e. half of 2000 kW) in terms of magnitude. In this case, if the control value is equal to or larger than 1000 kW, a digital signal representing resistor bank $\alpha 7$ is 64 steps. Thus, a resistor bank used with a higher switching frequency would have a shorter lifetime.

Accordingly, the lifetime of the switch can be maintained by using the low-voltage banks $\alpha 4$-$\alpha 7$ associated with a higher switching frequency as a low-voltage bank αL via a transformer TR based on the fact that a longer lifetime is ensured for the switch under a low-voltage state.

Figure 6:
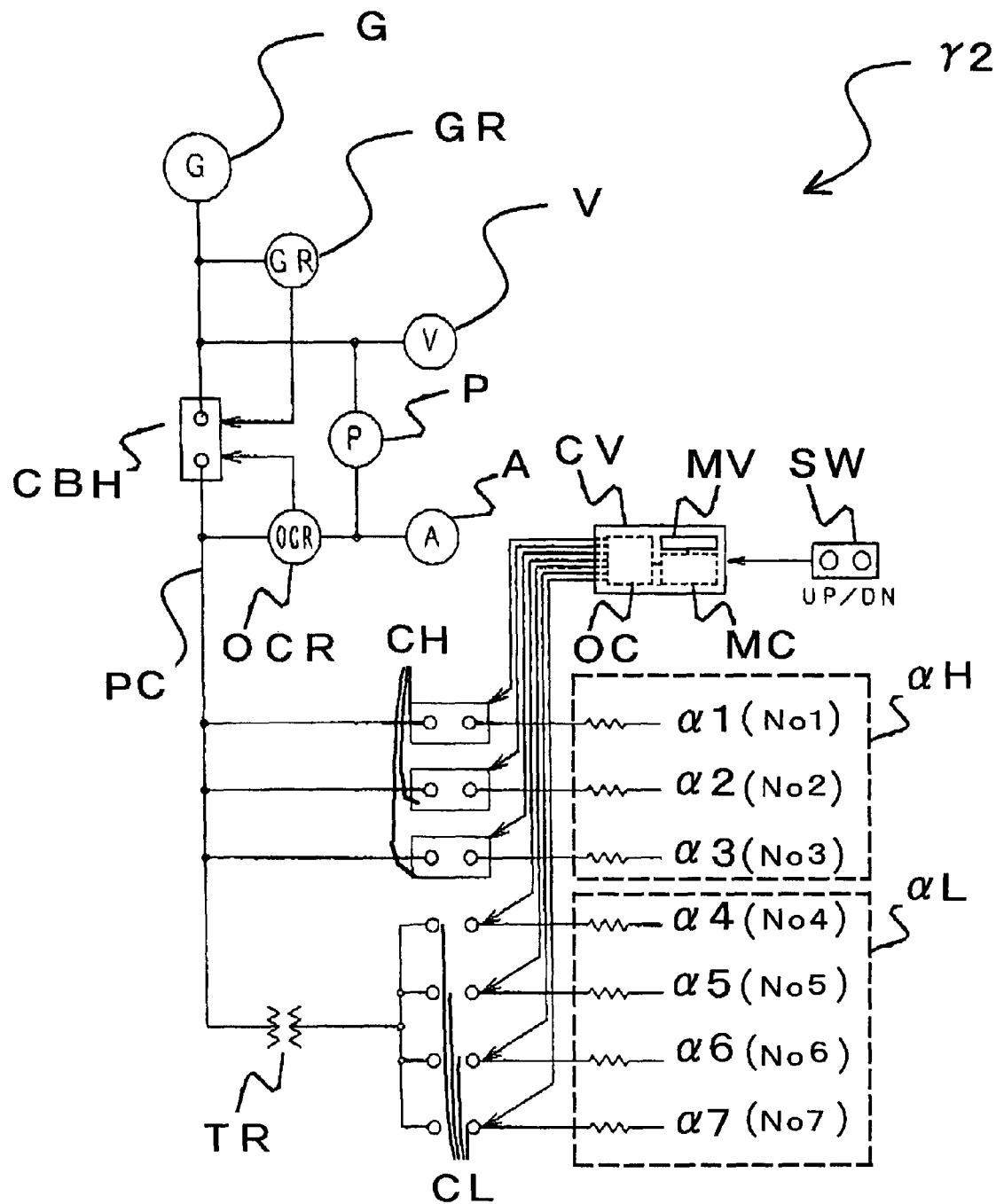
FIG. 6 is a one-line wiring diagram of a high-voltage load device wherein a low-voltage bank is used through a transformer in a high-voltage load calculation control apparatus according to the load calculation control apparatus example of the invention.
Figure 7:
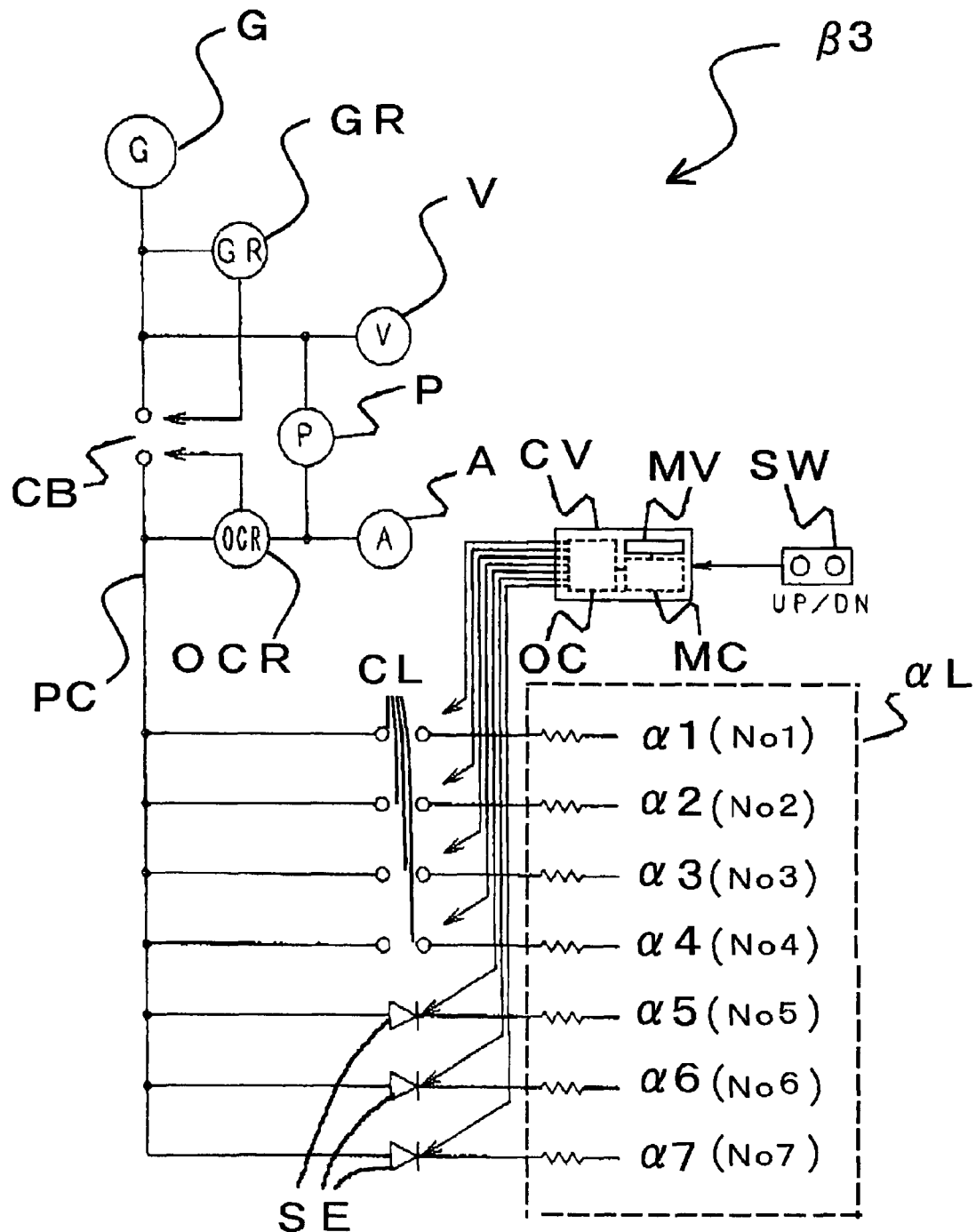
FIG. 7 is a one-line wiring diagram of a low-voltage load calculation control apparatus using a semiconductor switch according to an embodiment of the invention.

As shown in FIG. 6, in the high-voltage load device γ2, the resistor banks α1-α3 of low use are used as a high-voltage bank αH only via the high-voltage switches CH and the controller CV, while the resistor banks α4-α7 of high use are converted to a low-voltage bank αL by the use of the transformer TR and the low-voltage switches CL.

Further, for combined application of the high-voltage bank αH and the low-voltage bank αL, the operation time of the high-voltage switch generally takes about 10 seconds. Thus, assigning the low-voltage switch to the resistor bank αL of high switching frequency produces a good effect of reducing the operation time.

Embodiments 2

In the following, an embodiment of a load device using a semiconductor switch will be described with reference to FIGS. 7 and 8.

Load adjustments near a load control value, radiant heat from other resistor banks, switching, and fine adjustments of load depending on an outside air temperature considerably deteriorates the resistor banks of small capacity. Therefore, the workload of the resistor banks α5-α7 having a small capacity is reduced and a semiconductor switch SE is used together FIG. 7 shows a one-line wiring diagram of the low-voltage load device β3 to which semiconductor switches are added. Connecting small-capacity resistor banks α5-α7 of high switching frequency via such semiconductor switches SE would result in maintaining the contact life of the switch.

Figure 8:
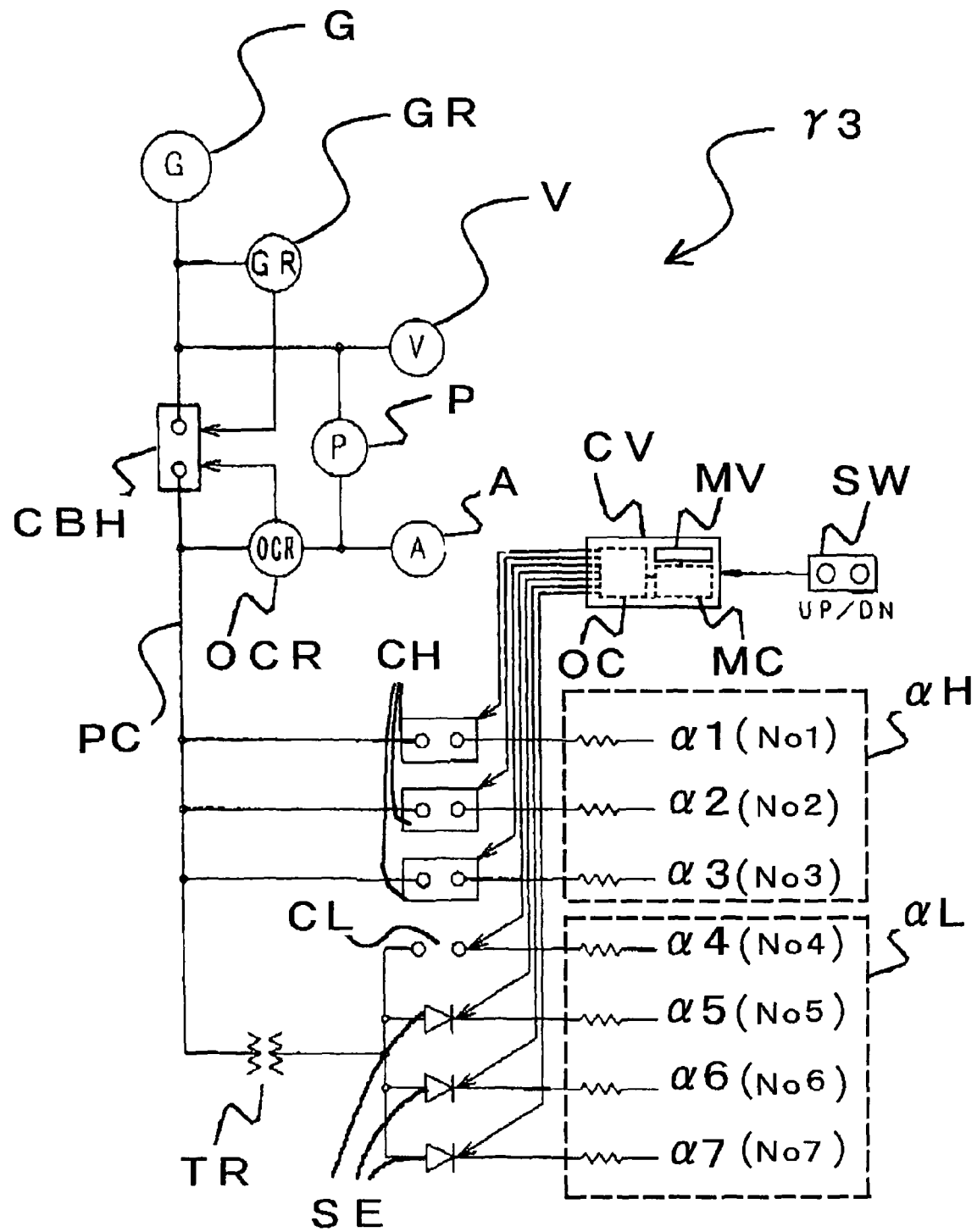
FIG. 8 is a one-line wiring diagram of a high-voltage load device wherein the semiconductor switch according to an embodiment of the invention is used and a low-voltage bank is used via a transformer in a high-voltage load calculation control apparatus.
Figure 9:
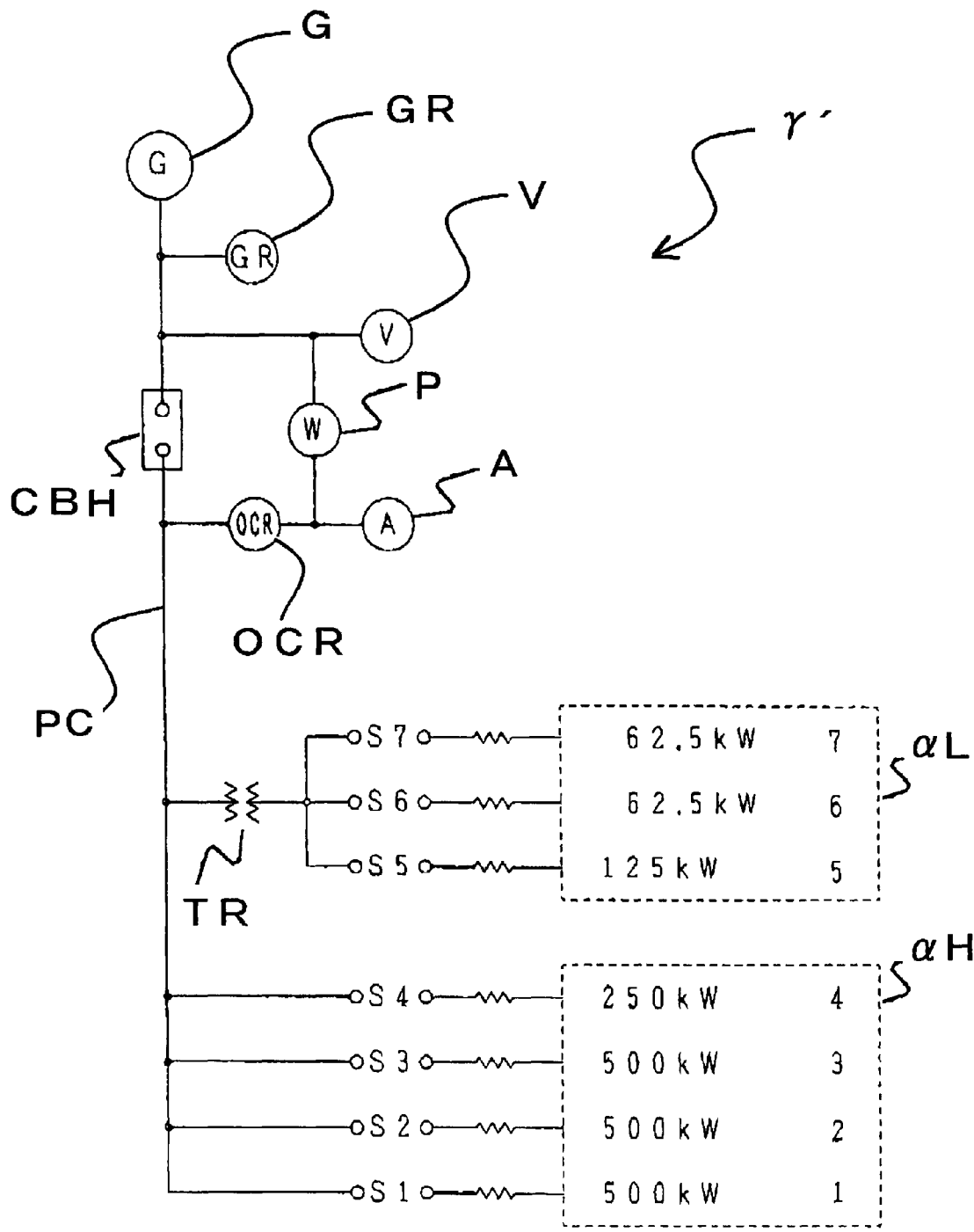
FIG. 9 is a one-line wiring diagram of a conventional dry-type high-voltage load device, showing a configuration example wherein resistor banks are stepwise grouped into combinations.

On the other hand, FIG. 8 is a one-line wiring diagram of the high-voltage load device β3 to which semiconductor switches are added. Specifically, such semiconductor switches are added to the high-voltage load device shown in FIG. 6. Similar to that shown in FIG. 5, the resistor banks α4-α7 are connected to the power cable PC via the transformer TR, wherein the resistor bank α4 is connected to the power cable via the low-voltage switch CL while each of the resistor banks α5-α7 are connected to the power cable PC via the semiconductor switch SE.

By adding the high-voltage resistor bank αH and the low-voltage resistor bank αL, and further adding the semiconductor switches SE to the high-voltage load device γ3, it becomes possible that even a small-capacity resistor bank of high switching frequency as the high-voltage load device γ3 which can operate over a long period of time.

While the best mode of the invention and the first and second embodiments according to the invention have been described, it should be understood that the present invention is not necessarily limited thereto. It will be apparent to those skilled in the art that various modifications can be appropriately made to the present invention without departing from the scope of the invention.

The invention claimed is:

1. A load calculation control method used for load characteristic test of an electric generator, wherein when a resistor bank group is divided into two or more, a total power capacity of all resistors is divided and allocated to respective resistor banks which are determined one after another in a decreasing manner from a higher priority to a lower priority by comparison operation, a combination of ON/OFF of the respective resistor banks is automatically adjusted in sequence from the higher priority to the lower priority and calculated, thereby allowing a load control value to be continuously and automatically changed during the conduction of the load characteristic test in a follow-up manner in order to approximate a target value, the method comprising the steps of:

after dividing the resistor bank group connected in parallel to a power supply unit via a power cable into two or more (in a range of 2 to N, where N is a natural number), allocating to a first to N-th divided resistor banks the results which is determined by dividing a total maximum power capacity of the resistor bank group sequentially based on binary system and arranging the results in an order from a higher priority to a lower priority of the power capacity corresponding to ½ to $1/(2^{n-1})$;

after a target load control value is selected by the use of control means connected to each of the resistor banks, by first calculation means within a comparison and transmission circuit within the control means, comparing a power capacity to be held by the first resistor bank corresponding to the first calculation means with a current load control value, and if the current load control value is not less than the power capacity, storing a value obtained by subtracting the power capacity from the current load control value as a remainder value by the control means, transmitting the remainder value to second calculation means in an analog manner, and transmitting in analog manner a digital signal representing ON-state to the first resistor bank, while when the current load control value is less than the power capacity, the current load control value is transmitted to the second calculation means in an analog manner;

in the second to N-th calculations, sequentially comparing the remainder value received from the calculation means of next higher priority or the current load control value with the power capacity of the resistor bank of next lower priority, wherein in each calculation, if the received remainder value or the current load control value is not less than the power capacity of the resistor bank, the power capacity is subtracted from the remainder value, the result is stored as a remainder value of next lower priority and is then transmitted to calculation means of next lower priority in an analog manner, and a digital signal representing ON-state is transmitted to the resistor bank corresponding to the current calculation means, while when the remainder value received from the next higher priority or the current load control value is less than the power capacity of the resistor bank of the next lower priority, the remainder value of next higher priority is transmitted as a remainder value of next lower priority to the calculation means of next lower priority in an analog manner; and repeating said second to N-th calculations to continuously determine a select combination of the respective resistor banks in which resistor bank ON/OFF state is automatically adjusted for the respective resistor banks in sequence from higher priority to lower priority so that the current load control value, which fluctuates by the convergence of the resistor banks, is continuously adjusted in a follow-up manner to approximate said target load control value.

2. The load calculation method according to claim 1, wherein the current load control value is increased by pushing an UP button of a push button switch connected to the control means, the result value is transmitted to a control value memory circuit of the control means, and a value stored in the control value memory circuit is updated to be increased;

wherein the current load control value is decreased by pushing an DOWN button of a push button switch, the result value is transmitted to the control value memory circuit, and a value stored in the control value memory circuit is updated to be decreased.

3. The load calculation method according to claim 1 or 2, wherein under a high-voltage load condition, with respect to a small-capacity resistor bank of high switching frequency, transforming means is used to convert to a low pressure such that a high-voltage resistor bank group and a low-voltage resistor bank group can be commonly used.

4. The load calculation control method according to claim 1 or 2,
wherein under a low-voltage load condition, load of a small capacity resistor bank of high switching frequency is reduced by providing semiconductor switching means via which the resistor bank is connected,
under a high-voltage load condition, with respect to a resistor bank of high switching frequency, a voltage is converted to be lowered by transforming means and load of especially a small-capacity resistor bank of high switching frequency is decreased by providing semiconductor switching means via which the small-capacity resistor bank is connected.

5. The load calculation control method according to claim 1 or 2,
wherein the number N of priorities resulting from the division is seven, and a total maximum power capacity among the resistor bank group is divided into seven priorities from $1/2$ to $1/128$ of the total capacity based on binary system.

6. The load calculation control method according to claim 1 or 2,
wherein the total maximum power capacity among the resistor bank group is increased by arranging in parallel a plurality of resistor banks of a required priority among N priorities obtained by division.

7. A load calculation control apparatus used for load characteristic test of an electric generator, wherein when a resistor bank group is divided into two or more, a total power capacity of all resistors is divided and allocated to respective resistor banks which are determined one after another in a decreasing manner from a higher priority to a lower priority by comparison operation, and a combination of ON/OFF of the respective resistor banks is automatically selected in sequence from the higher priority to the lower priority and calculated, thereby allowing a load control value to be continuously and automatically changed during the conduction of the load characteristic test in a follow-up manner in order to approximate a target value, the apparatus comprising:
a plurality of resistor banks to which total power capacity among the resistor bank group is allocated sequentially from a higher priority to a lower priority in a decreasing manner based on calculation in order to divide the resistor bank connected in parallel to an end of a power cable connected to a power supply unit into two or more (in a range of 2 to N, where N is a natural number);
a switch for turning ON/OFF each bank, through which each resistor bank of the resistor bank group is connected;
a control value memory circuit for storing the selected load control value and transmitting it in an analog manner;
a control unit having a comparison and transmission circuit, wherein the comparison and transmission circuit sequentially performs first to N-th calculations comparing the load control value transmitted from the control value memory circuit with the power capacities of the respective resistor banks corresponding to first and N-th resistor banks and making subtraction as required, and transmits a resultant digital signal calculated by the calculation to each corresponding switch to cause the switch to open or close; and
a pushbutton switch having an UP button for supplying an analog value for causing a load control value selected and stored in the control value memory circuit to increase, and a DOWN button for supplying an analog value for causing the load control value to decrease,
the control unit comprising means for automatically and continuously repeating the first to N-th calculations, thereby allowing a combination of ON/OFF of the respective resistor banks to be automatically adjusted in sequence from the higher priority to the lower priority and calculated, and allowing the load control value, which fluctuates by the convergence of the resistor banks, to be continuously adjusted in a follow-up manner in order to approximate said target value.

8. The load calculation control apparatus according to claim 7,
wherein the first to N-th resistor banks of the resistor bank group respectively hold the power capacity corresponding to $1/2$ to $1/(2^{n-1})$ (where N is a natural number) of the total maximum power capacity based on binary system.

9. The load calculation control apparatus according to claim 7,
wherein the control unit has a control value measurement device which digitally indicates in a detectable manner the value of the load control value subjected to an updatable adjustment by means of the push button switch.

10. The load calculation control apparatus according to claim 7,
wherein under a high-voltage load environment, a transformer via each of the plurality of resistor banks of a lower power capacity among the resistor bank group is provided such that the each resistor bank to which the transformer is connected can be used as a low-voltage resistor bank group,
wherein a high-voltage resistor bank group without the transformer and the low-voltage resistor bank group with the transformer can be used in parallel.

11. The load calculation control apparatus according to claim 7,
wherein under a low-voltage load environment, a semiconductor switch through which each of the plurality of resistor banks of lower power capacity within the resistor bank group can be provided; and
wherein under a high-voltage load environment, the transformer via each of the plurality of resistor banks of a lower power capacity among the resistor bank group is provided such that the each resistor bank to which the transformer is connected can be used as a low-voltage resistor bank group, and a semiconductor switch through which each resistor bank of the low-voltage resistor bank group is connected is provided.

12. The load calculation control apparatus according to any one of claims 8 to 11,
wherein the number N of priorities obtained by division is seven, and the priorities are respectively associated with power capacities of $1/2$, $1/4$, $1/8$, $1\backslash16$, $1\backslash32$, $1\backslash64$ and $1/128$ of the total maximum power capacity.

13. The load calculation control apparatus according to any one of claims 7 to 11,
wherein the resistor bank group has a plurality of resistor banks of the same required priority from the N priorities which are arranged in parallel.

14. The load calculation control apparatus according to any one of claims 7 to 11,
wherein the power cable is connected to an overcurrent relay and a current meter on a load side opposite a main breaking circuit, and connected to a ground relay and a voltmeter on a power supply side and further connected to a wattmeter opposite the ammeter and the voltmeter.

* * * * *